United States Patent
Liao et al.

(10) Patent No.: US 10,236,181 B2
(45) Date of Patent: Mar. 19, 2019

(54) MANUFACTURING SYSTEM AND METHOD FOR FORMING A CLEAN INTERFACE BETWEEN A FUNCTIONAL LAYER AND A TWO-DIMENSIONAL LAYEYED SEMICONDUCTOR

(71) Applicant: BEST CHAMPION TECHNOLOGY CO., LTD., Hsinchu (TW)

(72) Inventors: Chiu-Chuan Liao, Hsinchu (TW); Yi-Ping Lin, Hsinchu (TW); Chao-Hui Yeh, Hsinchu (TW)

(73) Assignee: BEST CHAMPION TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/665,486

(22) Filed: Aug. 1, 2017

(65) Prior Publication Data
US 2019/0043720 A1 Feb. 7, 2019

(51) Int. Cl.
*H01L 21/02* (2006.01)
*H01L 21/027* (2006.01)
*H01L 29/66* (2006.01)

(52) U.S. Cl.
CPC .. *H01L 21/02694* (2013.01); *H01L 21/02046* (2013.01); *H01L 21/02063* (2013.01);
(Continued)

(58) Field of Classification Search
CPC ......... H01L 21/02063; H01L 21/76814; H01L 29/1606; H01L 29/66015–29/66045; H01L 21/024–21/02411; H01L 21/02417; H01L 21/02469–21/0248; H01L 21/02551–21/02562; H01L 21/02568; H01L 29/66969
See application file for complete search history.

(56) References Cited

U.S. PATENT DOCUMENTS

| | | | |
|---|---|---|---|
| 2012/0141799 A1* | 6/2012 | Kub | B82Y 30/00 428/408 |
| 2015/0247258 A1* | 9/2015 | Diankov | H01M 4/8817 117/106 |
| 2016/0240719 A1* | 8/2016 | Lin | H01L 21/0262 |

OTHER PUBLICATIONS

Tao et al., The morphology of graphene sheets treated in an ozone generator, 2011, Journal of Physical Chemistry, vol. 115, pp. 18257-18260.*

(Continued)

*Primary Examiner* — Bryan R Junge
(74) *Attorney, Agent, or Firm* — Li & Cai Intellectual Property (USA) Office (57) ABSTRACT

A manufacturing system and a method for forming a clean interface between a functional layer and a 2D layered semiconductor are provided herein. In the steps of the method, the substrate equipped with the 2D layered semiconductor is exposed to a reaction gas, and a stimulus is applied to the reaction gas to generate active particles having higher selectivity toward contaminants on the exposed surface of the 2D layered semiconductor so that the contaminants can be decomposed and removed. Additionally, the contaminants can be removed without damage to the 2D layered semiconductor. A functional layer is in-situ deposited to be in contact with the 2D layered semiconductor. Without the contaminants, a clean interface between the functional layer and the 2D layered semiconductor can be obtained and the 2D layered semiconductor can exhibit better electrical properties.

16 Claims, 9 Drawing Sheets

(52) U.S. Cl.
CPC .... *H01L 21/0273* (2013.01); *H01L 21/02301* (2013.01); *H01L 21/02568* (2013.01); *H01L 21/02661* (2013.01); *H01L 29/66015* (2013.01); *H01L 29/66969* (2013.01)

(56) References Cited

OTHER PUBLICATIONS

Li et al., "Ultraviolet/oxone treatment to reduce metal-graphene contact resistance," 2013, Applied Physics Letters, vol. 102, pp. 183110.*

Robinson et al., "Contacting Graphene," 2011, Applied Physics Letters, vol. 98, pp. 053103.*

Azcatl et al., 'HfO2 on UV—O3 exposed transition metal dichalcogenides: interfacial reactions study,' 2015, 2D Materials, vol. 2, 014004 (Year: 2015).*

* cited by examiner

MANUFACTURING SYSTEM AND METHOD FOR FORMING A CLEAN INTERFACE BETWEEN A FUNCTIONAL LAYER AND A TWO-DIMENSIONAL LAYEYED SEMICONDUCTOR

BACKGROUND OF THE INVENTION

1. Field of the Invention

The instant disclosure relates to a manufacturing system and a method for forming a functional layer on a 2D layered semiconductor; in particular, to a manufacturing system and method for forming a clean interface between the functional layer and the 2D layered semiconductor.

2. Description of Related Art

The two-dimensional layered semiconductors, such as graphene or two-dimensional transition metal dichalcogenides, TMDs, have recently captured enormous attention in the field of optoelectronics and spintronics since the discovery that graphene or monolayer semiconducting TMDs have preferred physical and electrical properties such that the two-dimensional (2D) layered semiconductors have good developmental and applied potential.

However, contaminates, especially photoresist residues, are easily adsorbed onto the surface of the 2D layered semiconductor. Accordingly, after the photoresist on the 2D layered semiconductor is patterned, the photoresist residues may still remain on the exposed 2D layered semiconductor and form a continuous thin film. During the following step of depositing a metal layer on the exposed 2D layered semiconductor to form a contact for connecting to an external circuit, the photoresist residues will exist between the 2D layered semiconductor and the metal layer.

However, the photoresist residues or the other contaminates existing between the interface between the metal layer and the 2D layered semiconductor will seriously affect the quality of the electrical contact between the metal layer and the 2D layered semiconductor. That is, it is harder for the electrons to tunnel from the 2D layered semiconductor to the metal layer due to the photoresist residues or contaminates. Furthermore, the poor electrical contact may also result in higher impedance of the electronic device.

Since the 2D layered semiconductor has an ultra-thin thickness of a few atomic layers, the 2D layered semiconductor is more sensitive to the surface contaminates, and a higher surface cleanliness of the 2D layered semiconductor is required compared to three-dimensional materials. Additionally, the surface cleanliness of the 2D layered semiconductor has become a critical factor affecting the overall electrical performance of the electronic device including the 2D layered semiconductor.

SUMMARY OF THE INVENTION

The object of the instant disclosure is to provide a manufacturing system and a method for forming a clean interface between a functional layer and a 2D layered semiconductor.

In order to achieve the aforementioned objects, according to an embodiment of the instant disclosure, a method for forming a clean interface between a functional layer and a 2D layered semiconductor includes the following steps. First, a substrate having the 2D layered semiconductor is provided, and a photoresist layer is formed on the 2D layered semiconductor. Subsequently, the photoresist layer is patterned to form at least one contact opening. Next, the substrate equipped with the 2D layered semiconductor and the patterned photoresist layer is exposed to a reaction gas. A stimulus is provided so that a chemical reaction is induced on the reaction gas to generate active particles having higher selectivity toward contaminants on the exposed surface of the 2D layered semiconductor so as to remove the contaminants. Subsequently, a functional layer is in-situ deposited in the contact opening to be in contact with the 2D layered semiconductor.

In order to achieve the aforementioned objects, according to an embodiment of the instant disclosure, a method for forming a contact between a functional layer and a 2D layered semiconductor includes the following steps. First, a substrate having an initial 2D layered semiconductor is provided. Subsequently, the substrate having the initial 2D layered semiconductor is exposed to a reaction gas. Thereafter, a stimulus is provided to induce a chemical reaction on the reaction gas to generate active particles for chemically reacting with a surface layer of the initial 2D layered semiconductor. Subsequently, the functional layer is formed to be in contact with a treated surface of the 2D layered semiconductor.

In order to achieve the aforementioned objects, according to an embodiment of the instant disclosure, a manufacturing system is provided. The manufacturing system includes a first main apparatus having a first main chamber and a pre-processing apparatus. The pre-processing apparatus includes a pre-chamber, a gas supply unit, a vacuum unit, and a light-emitting unit. The pre-chamber is in fluid communication with the first main chamber to allow a substrate having a 2D layered semiconductor to be in-situ transferred between the first main chamber and the pre-chamber. The gas supply unit is in fluid communication with the pre-chamber to supply a reaction gas. The vacuum unit is in fluid communication with the pre-chamber to introduce a vacuum into the pre-chamber. The light-emitting unit provides a stimulus for the reaction gas to generate active particles so as to remove contaminants on the 2D layered semiconductor or oxidize a surface layer of the 2D layered semiconductor.

In the manufacturing system and the method for forming a contact between the functional layer and the 2D layered semiconductor provided in the instant disclosure, the photoresist residues remaining on the outer surface of the 2D layered semiconductor can be decomposed and removed. The active particles react with the contaminants, such as photoresist residues, more easily than with the 2D layered semiconductor due to the higher crystallinity of the 2D layered semiconductor. Accordingly, by controlling the reaction time, the contaminants can be completely removed from the surface of the 2D layered semiconductor before the damage of the 2D layered semiconductor.

In order to further the understanding regarding the instant disclosure, the following embodiments are provided along with illustrations to facilitate the disclosure of the instant disclosure.

BRIEF DESCRIPTION OF THE DRAWINGS

FIG. 1 shows a flow chart of a method for forming a contact between a 2D layered semiconductor and a functional layer in accordance with an embodiment of the instant disclosure;

DETAILED DESCRIPTION OF THE PREFERRED EMBODIMENTS

The aforementioned illustrations, descriptions, and advantages of various aspects of the inventions will be apparent from the subsequent descriptions of various concepts and embodiments within the broader scope of the inventions. Subject matter introduced above and discussed in greater detail below may be implemented in any of numerous ways, as the subject matter is not limited to any particular manner of implementation. Examples of specific implementations and applications below are provided primarily for illustrative purposes.

Unless otherwise defined, used or characterized herein, terminologies (technical and scientific terms) applied herein are to be interpreted as having a meaning that is consistent with their accepted meaning in the context of the relevant art and are not to be interpreted in an idealized manner unless expressly defined herein.

As applied in the instant disclosure, the singular forms, such as "a" and "an" are intended to include the plural forms as well, unless the context indicates otherwise. Additionally, the terms, "includes," "including," "comprises" and "comprising," indicate the presence of the stated elements or steps but do not preclude the addition of one or more other elements or steps.

Relative spatial terms, such as "above," "under," "top," "bottom", and the like, may be present in the instant disclosure to facilitate descriptions of relationships of one element relative to another element(s) as illustrated in the figures. It shall be understood that the relative terms regarding spatial orientation, as well as the illustrated configurations, are intended to encompass various orientations of the apparatus during, prior to, or post operation in addition to the orientations described herein and depicted in the figures so long as the purpose of the device(s) or element(s) remain. For example, if an element in the figures is depicted as "bottom" or "under" another element(s) or device(s), then the element shall also be understood as being oriented "under" the other element or device only in the specified orientation in the specified embodiment, but the orientation of the device(s) or element(s) shall not be bounded by the specific orientation in the specific embodiment.

Further still, in this disclosure, when an element is referred to as being "on" or "connected to" another element, it may be directly on, connected or coupled to the other element or intervening elements may be present unless otherwise specified.

In the instant disclosure, a manufacturing system and method for forming a clean interface between a two-dimensional (2D) layered semiconductor and a functional layer are provided. The method disclosed herein can be integrated in a fabrication process of any electronic device.

Figure 1:
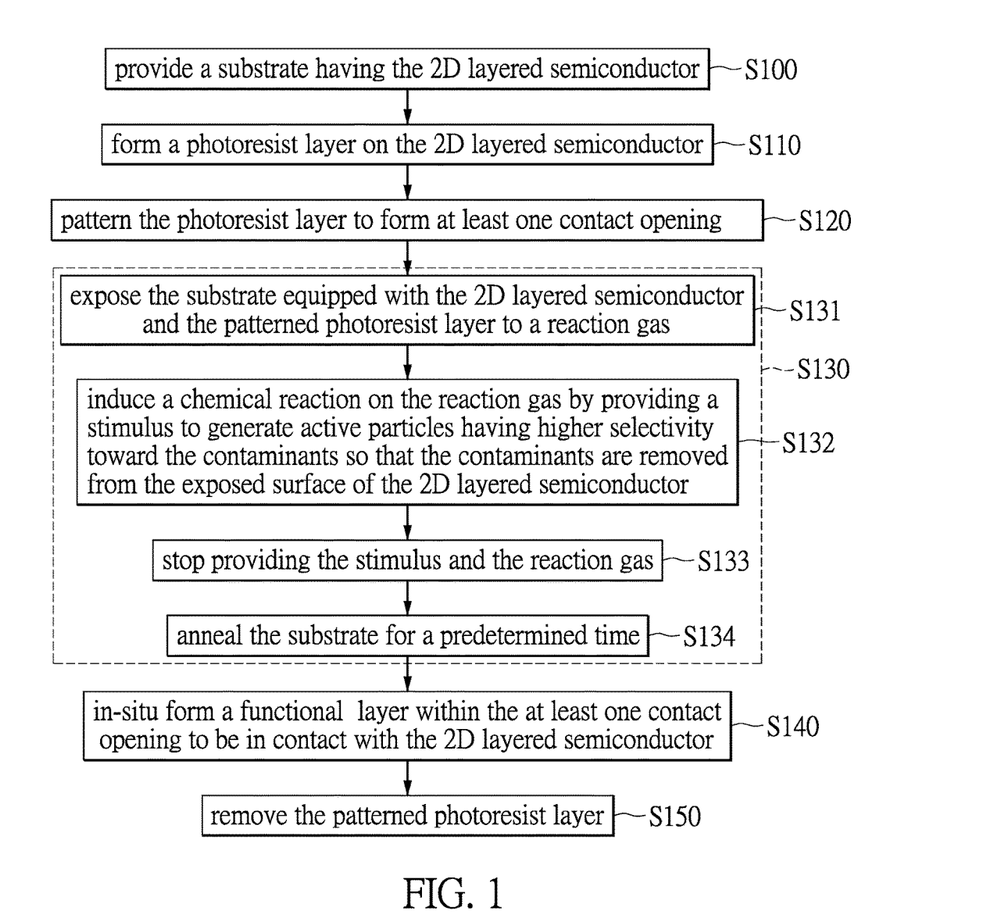

Please refer to FIG. 1 and FIGS. 2A to 2F. FIG. 1 shows a flow chart of a method for forming a contact between a 2D layered semiconductor and a functional layer in accordance with an embodiment of the instant disclosure, and FIGS. 2A to 2F show the process steps for forming a functional layer on a 2D layered semiconductor.

In step S100, a substrate having a 2D layered semiconductor is provided.

Figure 2A:
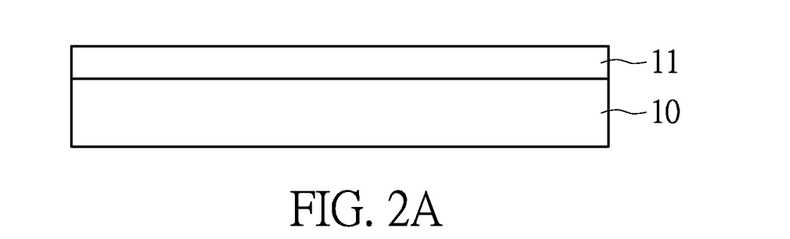
FIGS. 2A to 2F show the process steps for forming a contact between a functional layer and a 2D layered semiconductor in accordance with an embodiment of the instant disclosure.

As shown in FIG. 2A, the two-dimensional (2D) layered semiconductor 11 has been formed on a substrate 10. The substrate 10 can be made of sapphire, silicon-based material (such as silicon dioxide, glass, or quartz), aluminum oxide ($Al_2O_3$), mica plate or the other dielectric materials, and is not limited to the examples provided herein.

The 2D layered semiconductor 11 can be graphene or metal based chalcogenide film. The metal based chalcogenide film can be a transition metal dichalcogenide (TMD) film. The term "chalcogenides" include dichalcogenides, trichalcogenides, and does not preclude chalcogenides having more than one chalcogen atom. Moreover, the dichalcogenide has a composition generally represented by a formula, $MX_2$, where M is a metal based precursor, and X is a chalcogen such as sulfur, selenium, tellurium, and the combination thereof, and the chalcogens are not limited to the examples provided herein. For example, the two-dimensional layered semiconductor can be transition metal dichalcogenides (TMDs), III-VI compound semiconductors, or II-VI compound semiconductors. The transition metal dichalcogenides can be $MoS_2$, $MoSe_2$, $MoTe_2$, $HfS_2$, $HfSe_2$, $HfTe_2$, $WS_2$, $WSe_2$, $WTe_2$, $NbS_2$, $NbSe_2$, $NbTe_2$, $ReS_2$, $ReSe_2$, $ReTe_2$, and so on. The III-VI compound semiconductors may be GaS, GaSe, GaTe, $In_2S_3$, $In_2Se_3$, or $In_2Te_3$. The IV-VI compound semiconductors may be GeSe, or GeTe.

The 2D layered semiconductor 11 can be deposited on the substrate 10 by chemical vapor deposition (CVD). Moreover, the 2D layered semiconductor 11 has an ultrathin thickness of less than 1.3 nm.

Figure 2B:
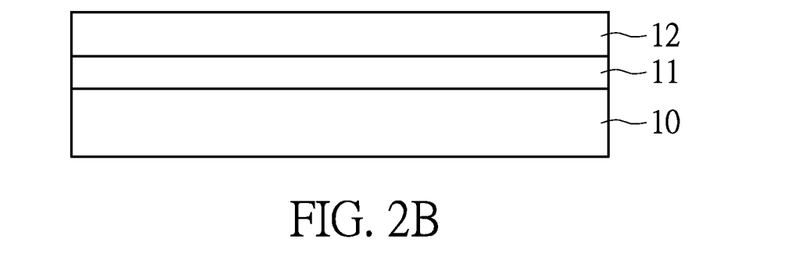

Subsequently, in step S110, the photoresist layer is formed on the 2D layered semiconductor. As shown in FIG. 2B, the photoresist layer 12 is formed on the 2D layered semiconductor 11 and covers the top surface of the 2D layered semiconductor 11. The photoresist layer 12 usually includes organic material, such as resin, and can be coated on the 2D layered semiconductor by a spray coating process.

In the subsequent step S120, the photoresist layer 12 is patterned to form at least one contact opening. The photoresist layer 12 can be patterned by an exposure process and development process through a mask so that the contact opening is formed at a predetermined position.

Figure 2C:
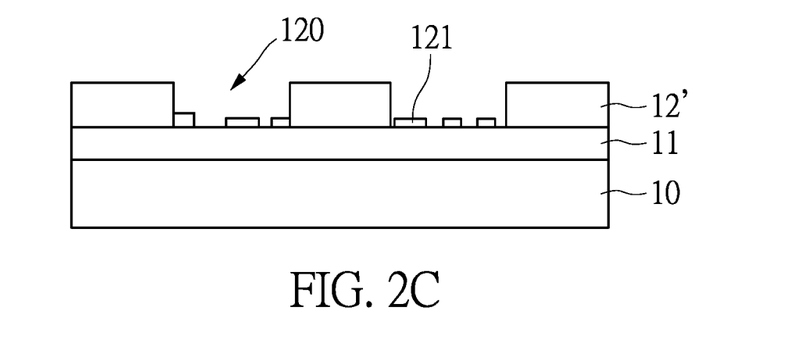

As shown in FIG. 2C, two contact openings 120 are formed to expose a part of the surface of the 2D layered semiconductor 11. However, contaminants 121, particularly photoresist residues, remain in the contact openings 120 and cover the surface of the 2D layered semiconductor 11. In the instant embodiment, the contaminants 121, such as the photoresist residues, are separately left in the at least one contact opening 120.

Figure 2D:
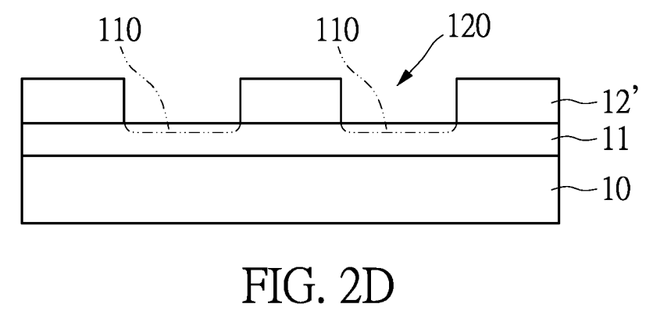

As mentioned above, the 2D layered semiconductor 11 has ultra-thin thickness; hence, higher surface cleanliness of the 2D layered semiconductor 11 is required in the fabrication process of an electronic device. Therefore, in the following step S130, the contaminants 121 are removed. The damage of the ultra-thin 2D layered semiconductor 11 is avoided as much as possible during the removing step of the contaminants 121, as shown in FIG. 2D.

Please refer to FIG. 1. In the instant embodiment, the removing process S130 further includes step S131, step S132, step S133, and step S134. In step S131, the substrate equipped with the 2D layered semiconductor and the patterned photoresist layer is exposed to a reaction gas. The reaction gas can be oxygen gas or hydrogen gas.

In step S132, a chemical reaction is induced on the reaction gas by providing a stimulus to generate active particles having higher selectivity toward the contaminants so that the contaminants are removed from the exposed surface of the 2D layered semiconductor. In the instant embodiment, the stimulus is UV radiation, and the reaction gas is oxygen. With the UV radiation, the oxygen is decomposed into oxygen radicals, and ozone molecules can be formed by the recombination of some free oxygen radicals. The oxygen radicals and ozone molecules can react with the contaminants that remain on the exposed surface of the 2D layered semiconductor, thereby decomposing and removing the contaminants.

Since the 2D layered semiconductor has a higher crystallinity than that of the contaminants, which have an amorphous and loose structure, the oxygen radicals and ozone molecules has higher selectivity toward the contaminants. Accordingly, by controlling the reaction time, the contaminants can be completely removed without damaging the 2D layered semiconductor.

In the instant embodiment, the UV radiation can have a wavelength ranging from 160 nm to 400 nm. Moreover, the active particles generated by exposing the reaction gas to the UV radiation also can damage the 2D layered semiconductor after the UV radiation is provided for a long time. Therefore, the UV radiation is periodically switched on and off to avoid damage of the 2D layered semiconductor by using a chopper.

Specifically, during an on/off cycle, the UV radiation can be switched on for about 10 seconds, and then switched off for less than one minute. The number of on/off cycles of the UV radiation can be determined according to actual demand.

In one embodiment, the removing process S130 can further include a step of heating the substrate to a reaction temperature before the step of inducing the chemical reaction on the reaction gas by providing the UV radiation. Heating the substrate can help removal of the contaminants. However, the reaction temperature is maintained at a range to avoid a damage of the 2D layered semiconductor due to too fast reaction rate. In one preferred embodiment, the substrate is heated to the reaction temperature of less than 100° C., substantially ranging from 25 to 100° C. The abovementioned heating step can be omitted in another embodiment.

Please refer to FIG. 1. After the contaminants in the contact openings are removed, in step S133, stop providing the stimulus and the reaction gas. In step S134, the substrate is annealed for a predetermined time. Specifically, the adsorbed water or the photoresist residues, which are not removed in the previous steps S131-S132, can be desorbed by annealing the substrate.

In another embodiment, the parts 110 of a surface layer (not labeled in FIG. 2D) of the 2D layered semiconductor 11 respectively exposed from the contact openings 120 may be in-situ oxidized during the step of inducing the chemical reaction on the reaction gas.

Specifically, the surface layer, which has a thickness of about 0.65 nm to 1.3 nm, may have lower crystalline quality than that of the other portions of the 2D layered semiconductor 11. The surface layer is oxidized more easily than the other portions of the 2D layered semiconductor 11 during the step of inducing the chemical reaction on the reaction gas. If the functional layer, which will be formed during the following step, is made of conductive material, a low contact resistance between the functional layer 13 and the 2D layered semiconductor 11 will be required.

In general, compared with the condition of there being no oxide at the interface between a semiconductor material and the conductive material, the formation of an oxide at the interface usually results in higher contact resistance between the semiconductor material and the conductive material, so that a person of ordinary skill in the art would be inclined to remove the oxide at the interface.

However, in this case, the oxidized parts 110 of the 2D layered semiconductor 11 existing at the interface between the 2D layered semiconductor 11 and the functional layer 13 may promote the capability of electron or hole injection from the functional layer 13 to the 2D layered semiconductor 11 so that the lower contact resistance still can be obtained. That is to say, even though the oxidized parts 110 are kept at the interface between the functional layer 13 and the 2D layered semiconductor 11, the oxidized parts 110 do not impact on the electrical performance of the electronic device. Accordingly, in the instant embodiment, the oxidized parts 110 will be kept.

In one embodiment, the parts 110 of the surface layer can be in-situ oxidized by increasing the supply of the reaction gas, (e.g., oxygen gas), heating the temperature of the substrate 10, extending the reaction time, or providing higher intensity of the stimulus.

The abovementioned conditions, such as the reaction temperature of the substrate 10, the flow rate of the reaction gas, the reaction time, and the intensity of the stimulus, are adjustable in order to oxidize the parts 110 of the surface layer in the instant disclosure. However, the decomposition of the patterned photoresist layer 12' has to be avoided so that the contact opening 120 can be maintained in a predefined shape during the oxidation process of the parts 110 of the surface layer.

After the contaminants 121 are removed or the parts 110 of the surface layer of the 2D layered semiconductor 11 are oxidized, proceed to the step S140.

Figure 2E:
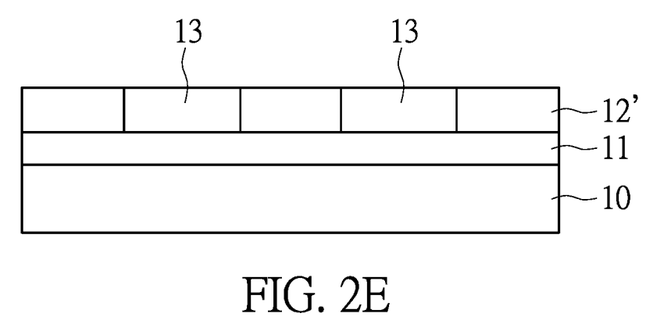

In step S140, a functional layer is in-situ formed within the contact opening to be in contact with the 2D layered semiconductor. The functional layer 13 can be deposited by chemical vapor deposition (CVD) or physical vapor deposition (PVD), such as an evaporation process. As shown in FIG. 2E, the functional layers 13 are respectively formed in corresponding contact openings 120 to be in contact with a treated surface of the 2D layered semiconductor 11 and a clean interface without the contaminants 120 or an electrical contact between each of the functional layers 13 and the 2D layered semiconductor 11 can be obtained.

Moreover, after the removing process, the substrate 10 equipped with the 2D layered semiconductor 11 and the patterned photoresist layer 12' is in-situ transferred from one vacuum chamber to another vacuum chamber to deposit the functional layer 13. As such, the exposed and treated surface of the 2D layered semiconductor 11 would not be contaminated again.

The functional layer 13 can be made of conductive material, dielectric material or the combination thereof. In one embodiment, the functional layer 13 is made of conductive material, such as metal or alloy, so that an electrical contact between the function layer 13 and the 2D layered semiconductor 11 can be formed. Without the contaminants existing in the interface between the functional layer 13 and the 2D layered semiconductor 11, preferable electrical contact formed between the functional layer and the 2D layered semiconductor can be obtained.

In another embodiment, the function layer 13 has a stacked structure which including a dielectric material directly in contact with the 2D layered semiconductor 11 and a conductive material formed on the dielectric material. The dielectric material can be aluminum oxide ($Al_2O_3$), hafnium oxide ($HfO_2$), or titanium oxide ($TiO_2$), to serve as a gate insulating layer of a field-effect transistor, and the metal material can be aluminum, silver, tin, copper, gold, or platinum, to serve as gate electrode of the field-effect transistor. That is, the material and structure of the functional layer 13 can be selected according to the practical demands of the electronic device.

Figure 2F:
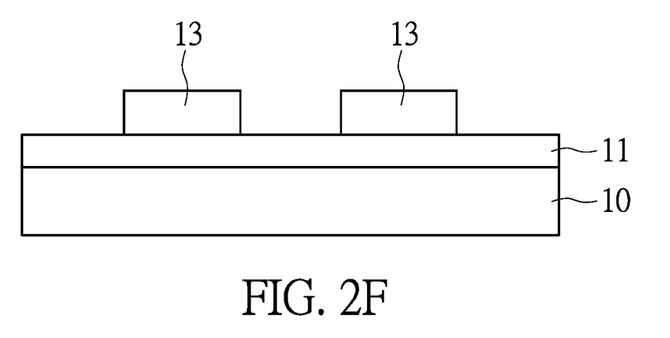

In step S150, the patterned photoresist layer is removed completely. As shown in FIG. 2F, the patterned photoresist layer 12' is removed. If there are post-etch residues on the surface of the 2D semiconductor 12, post-etch residues also can be removed by the active particles which are generated by providing the stimulus to induce the chemical reaction on the reaction gas.

Figure 3:
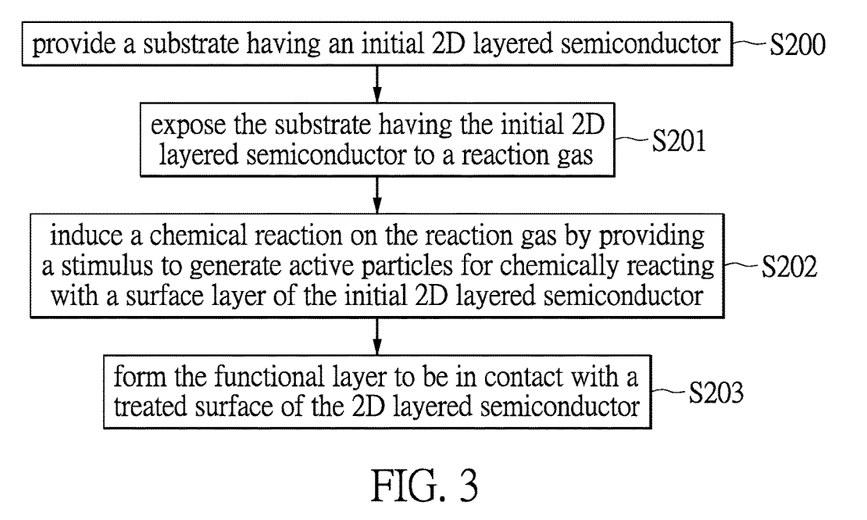
FIG. 3 shows a flow chart of a method for forming a contact between a 2D layered semiconductor and a functional layer in accordance with another embodiment of the instant disclosure.
Figure 4A:
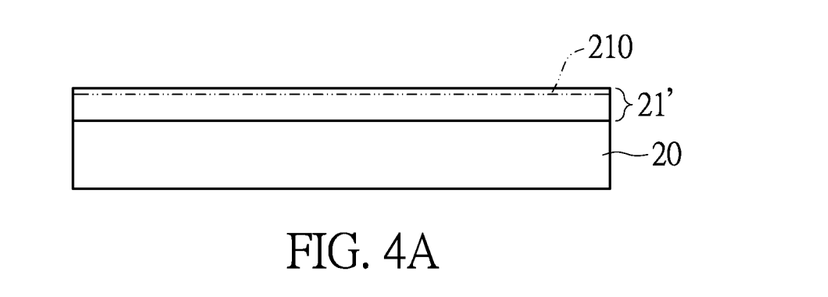
FIGS. 4A to 4C show the process steps for forming a functional layer on a 2D layered semiconductor in accordance with an embodiment of the instant disclosure.
Figure 4B:
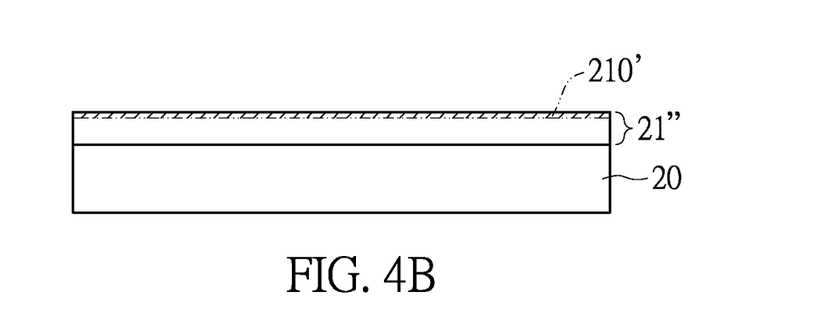
Figure 4C:
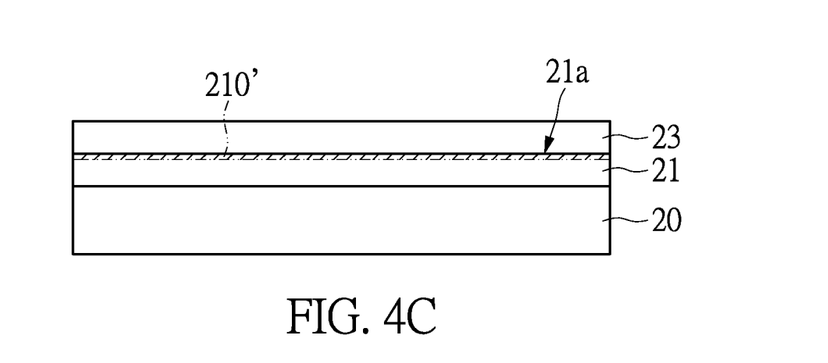

Please refer to FIG. 3 and FIGS. 4A to 4C. FIG. 3 shows a flow chart of a method for forming a contact between a 2D layered semiconductor and a functional layer in accordance with another embodiment of the instant disclosure. FIGS. 4A to 4C show the process steps for forming a functional layer on a 2D layered semiconductor according to the method shown in FIG. 3.

In step S200, a substrate having an initial 2D layered semiconductor is provided. As shown in FIG. 4A, an initial two-dimensional (2D) layered semiconductor 21' has been formed on a substrate 20. Similar to the aforementioned embodiment, the substrate 20 can be made of sapphire, silicon-based material (such as silicon dioxide, glass, or quartz), aluminum oxide ($Al_2O_3$), mica plate or the other dielectric materials, and is not limited to the examples provided herein, and the initial 2D layered semiconductor 21' can be made of graphene or metal based chalcogenide film.

Notably, a surface layer 210 of the initial 2D layered semiconductor may have relatively lower crystallinity than that of the other portions due to the existence of defects. The surface layer 210 has a thickness of about 0.65 nm to 5.2 nm. Additionally, the surface layer 210 with defects may result the electrical performance of the fabricated electronic device is not ideal. Accordingly, in following steps, the initial 2D layered semiconductor is treated by a surface treatment to improve the electrical performance of the fabricated electronic device.

As shown in FIG. 3, in step S201, the substrate having the initial 2D layered semiconductor is exposed to a reaction gas. The reaction gas can be oxygen gas or hydrogen gas. In step S202, a chemical reaction is induced on the reaction gas by providing a stimulus to generate active particles for chemically react with a surface layer of the initial 2D layered semiconductor. Since the surface layer 210 has lower crystallinity and more defects than the other portions of the initial 2D layered semiconductor 21', a chemical reaction between the surface layer 210 and the active particles occurs more easily and then a chemically treated surface layer 210' is formed, as shown in FIG. 4B.

In one embodiment, the reaction gas is oxygen gas and the stimulus is UV radiation. As mentioned above, the oxygen is decomposed into oxygen radicals, and ozone molecules can be formed by the recombination of some free oxygen radicals. In the instant embodiment, the oxygen radicals and ozone molecules can react with the surface layer 210 so that the surface layer 210 is oxidized. In other words, the chemically treated surface layer 210' is oxidized surface layer.

Furthermore, in one embodiment, before the surface layer 210 is oxidized, the substrate 20 is maintained at a first temperature during a first time period, in which the first temperature can range from 25° C. to 50° C. to clean the contaminants adsorbed to the surface of the initial 2D layered semiconductor.

That is to say, the chemically treated surface layer 210' can be in-situ formed after the contaminants adsorbed to surface of the initial 2D layered semiconductor 21'. Specifically, the chemically treated surface layer 210' can be formed by increasing the supply of the reaction gas, heating the temperature of the substrate 20, extending the reaction time, or providing higher intensity of the stimulus. In one embodiment, after the contaminants adsorbed to the surface of the initial 2D layered semiconductor 21' are cleaned, the substrate 20 can be heated and maintained at a second temperature ranging from 80° C. to 120° C., and the supply of the reaction gas can be increased during a second time period so as to form the chemically treated surface layer 210'.

Notably, the reaction time, the intensity of the stimulus, the supply of the reaction gas, and the temperature of the substrate 20 have to be controlled to prevent the other portions under the chemically treated surface layer 210' from chemical reaction during the step S202.

Please refer to FIG. 3. In step S203, the functional layer is formed to be in contact with the treated surface of the 2D layered semiconductor. As shown in FIG. 4C, the functional layer 23 is disposed on the chemically treated surface layer 210' of the 2D layered semiconductor 21. The functional layer 23 can be made of conductive material, dielectric material or the combination thereof. In one embodiment, the functional layer 23 is made of conductive material, such as metal or alloy, so that an electrical contact between the function layer 23 and the 2D layered semiconductor 21 can be formed.

As mentioned above, the formation of the oxidized surface layer (i.e., chemically treated surface layer 210') can improve the injection of electrons or holes from the conductive layer (i.e., the functional layer 23) into the 2D layered semiconductor 21, thereby reducing lower contact resistance between the functional layer 23 and the 2D layered semiconductor 21. Thus, the chemically treated surface layer 210' is not removed and kept between the functional layer 23 and the 2D layered semiconductor 21.

That is to say, if the method provided in the instant disclosure is used to fabricate electronic device, such as ultrathin body electronics, flexible electronics, optoelectronics, the electronic device will at least include the 2D layered semiconductor 21, the function layer 23 disposed on the 2D layered semiconductor 21 and the chemically treated surface layer 210' formed between the 2D layered semiconductor 20 and the function layer 23. Furthermore, the functional layer 23 can be a continuous layer or has a plurality of parts apart from one another.

Figure 5:
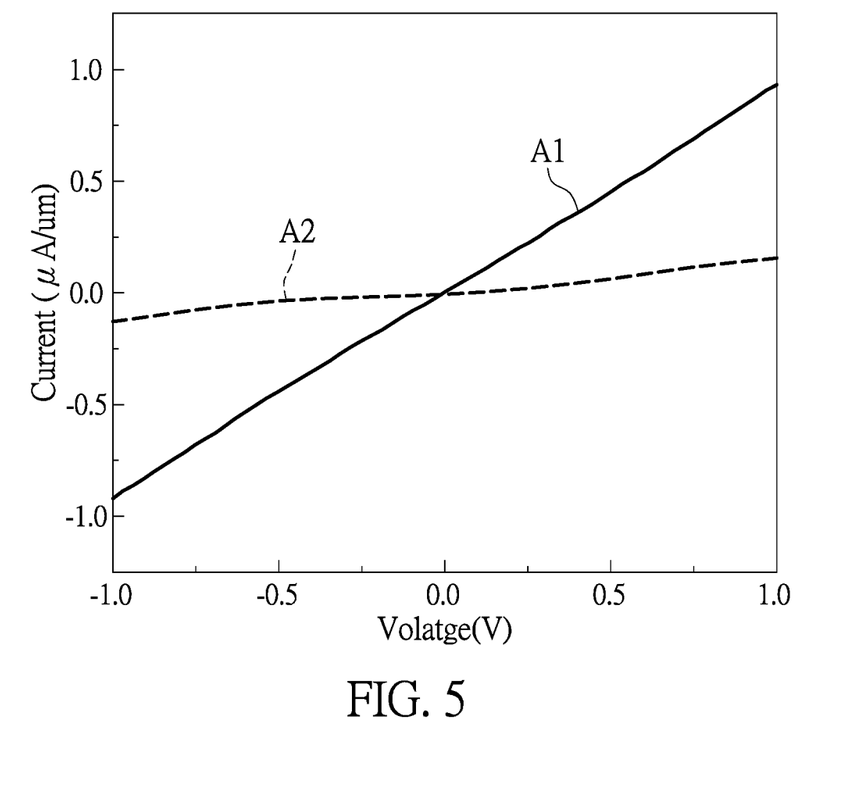
FIG. 5 shows the current-voltage (I-V) characteristics of the electrical contact between a functional layer and a 2D layered semiconductor with and without UV exposure.

Please refer to FIG. 5, which shows current-voltage (I-V) characteristics of the electrical contact between a functional layer and a 2D layered semiconductor with and without UV exposure. The curve A1 represents the I-V characteristic of the electrical contact between the functional layer and the 2D layered semiconductor with UV exposure, and the curve A2 represents the I-V characteristic of the electrical contact between the functional layer and the 2D layered semiconductor without UV exposure. In this embodiment, the 2D layered semiconductor is made of WSe2, and the functional layer is made of conductive material. As shown in FIG. 5, the slope of the curve A2 is less than that of the curve A1. Accordingly, the surface treatment provided in the instant disclosure can lead to lower contact resistance between the functional layer and the 2D layered semiconductor.

In another embodiment, the function layer 23 can be made of dielectric material, such as aluminum oxide ($Al_2O_3$), hafnium oxide ($HfO_2$), or titanium oxide ($TiO_2$), to serve as a protection layer or to modify the electrical characteristics, such as conductivity type or carrier concentration, of the 2D layered semiconductor 21. In another embodiment, the function layer 23 can have a stacked structure which including a dielectric material directly in contact with the 2D layered semiconductor 21 and a conductive material formed on the dielectric material. The dielectric material can serve as a gate insulating layer of a field-effect transistor, and the metal material, such as aluminum, silver, tin, copper, gold, or platinum, can serve as a gate electrode of the field-effect transistor. That is, the material and structure of the functional layer 23 can be determined according to the practical demands of the electronic device.

Figure 6:
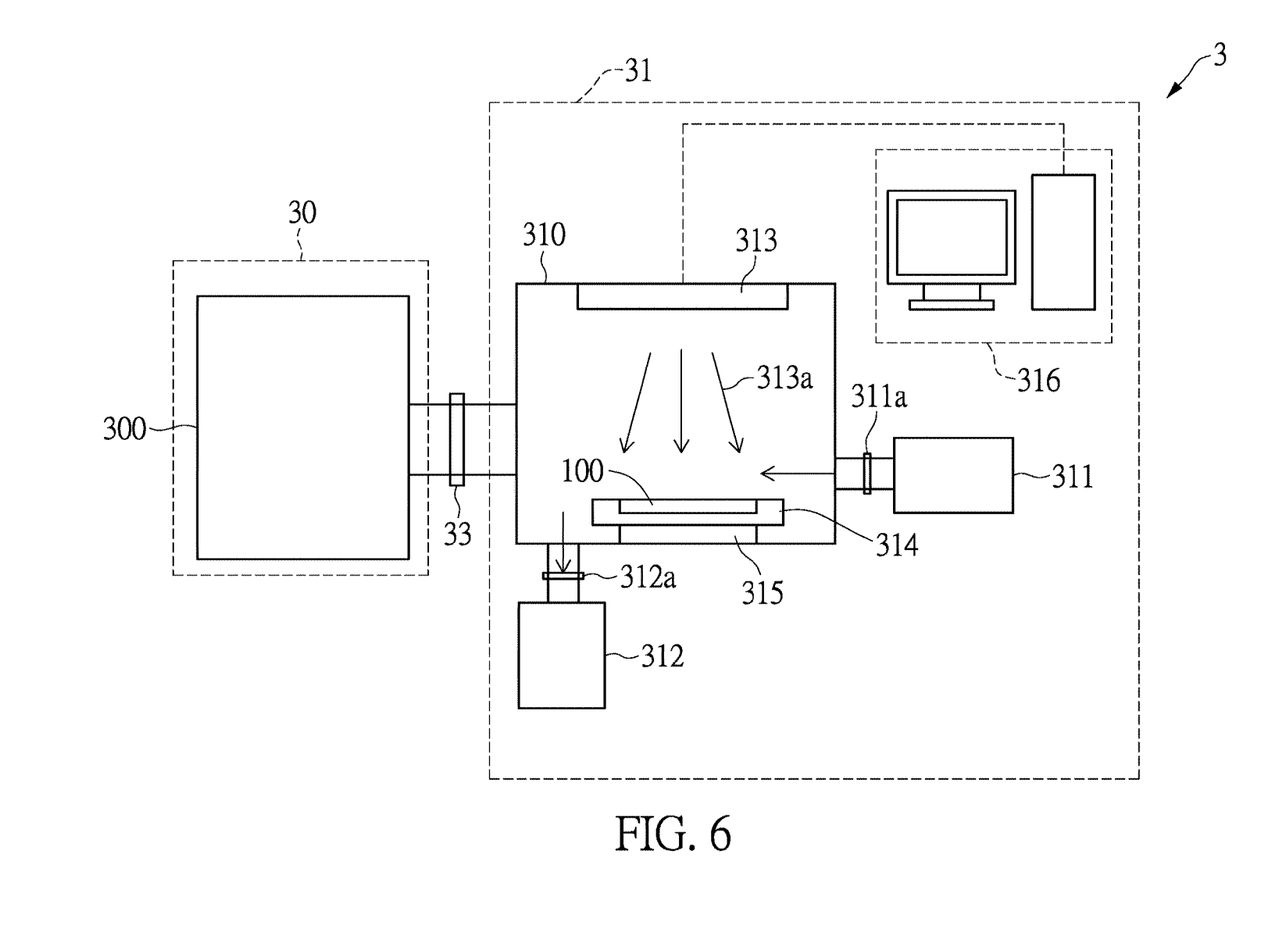
FIG. 6 shows a schematic diagram illustrating a manufacturing system for forming a contact between a 2D layered semiconductor and a functional layer in accordance with an embodiment of the instant disclosure.

Please refer to FIG. 6. FIG. 6 shows a schematic diagram illustrating a manufacturing system for forming clean interface or a contact between a 2D layered semiconductor and a functional layer in accordance with an embodiment of the instant disclosure. The manufacturing system 3 includes a first main apparatus 30, and a pre-processing apparatus 31.

The first main apparatus 30 can be a deposition apparatus or an inspection apparatus. Namely, the first main apparatus 30 can be a chemical vapor deposition (CVD) apparatus, a physical vapor deposition (PVD) apparatus, transmission electron microscopy (TEM), or Micro-PL/Raman spectroscopy. The first main apparatus 30 includes a first main chamber 300 for accommodating a substrate 100 and a vacuum setup (not shown in FIG. 6) to introduce a vacuum into the first main chamber 300. In one embodiment, the first main apparatus is a deposition apparatus, so that the aforementioned removing process S130 and the forming step S140 shown in FIG. 1 can be carried out by the manufacturing system 3 provided herein.

The pre-processing apparatus 31 includes a pre-chamber 310, a gas supply unit 311, a vacuum unit 312, and a light-emitting unit 313.

The pre-chamber 310 is in fluid communication with the first main chamber 300 so as to allow a substrate 100 to be in-situ transferred between the first main chamber 300 and the pre-chamber 310.

The substrate 100 can be equipped with the two-dimensional layered semiconductor which needs to have an ultra-clean surface for inspection. In another embodiment, the substrate 100 can be equipped with the two-dimensional layered semiconductor and the patterned photoresist layer, as shown in FIG. 2C, and the higher cleanliness of the exposed surface of the 2D layered semiconductor is required for the following deposition process. In another embodiment, the substrate 100 can be equipped with the initial 2D layered semiconductor, as shown in FIG. 4A, and the surface layer has to be chemically treated. The pre-processing apparatus 31 is configured to remove the contaminants remaining in the contact opening from the exposed surface of the 2D layered semiconductor or oxidize the surface layer.

Furthermore, a control valve 33 is disposed between the first main chamber 300 and the pre-chamber 310 for controlling the fluid communication between the pre-chamber 310 and the first main chamber 300. Before the substrate 100 is transferred into the first main chamber 300, the control valve 33 closes to maintain the pressure in the first main chamber 300 at a relatively high vacuum level. After performing the removing process on the substrate 100 in the pre-chamber 310, the control valve 33 opens so as to in-situ transfer the substrate 100 into the first main chamber 300 for deposition or inspection.

In the instant embodiment, the pre-processing apparatus 31 includes a substrate holder 314 and a heater 315. The substrate holder 314 is arranged in the pre-chamber 310 for supporting the substrate 100. The heater 315 is also arranged in the pre-chamber 310 and located under the substrate holder 314 for heating the substrate 100.

Both the gas supply unit 311 and the vacuum unit 312 are in fluid communication with the pre-chamber 310. The gas supply unit 311 can introduce a reaction gas, such as oxygen or hydrogen into the pre-chamber 310. In addition, the gas supply unit 311 can further include a flow control valve 311a for controlling the flow of the reaction gas.

The vacuum unit 312 is in fluid communication with the pre-chamber 310 to introduce a vacuum into the pre-chamber 310. During the removing process, the vacuum unit draws the gases from the pre-chamber 310 so as to maintain the pressure within the pre-chamber 310 at a predetermined value. Specifically, the vacuum unit 312 includes a vacuum pump (not shown), a regulator valve 312a, and a vacuum gauge (not shown). The vacuum pump is set up to create a vacuum in the pre-chamber 310. The vacuum gauge and the regulator valve 312a are used to respectively monitor and control the pressure inside the pre-chamber 310.

The light-emitting unit 313 is applied to provide a stimulus 313a for the reaction gas to generate active particles. The light-emitting unit 313 can be a UV radiation unit for providing UV radiation for the reaction gas so as to generate active particles. In one embodiment, the reaction gas is oxygen gas, and the active particles include oxygen radicals and ozone molecules. In another embodiment, the reaction gas is hydrogen gas, and the active particles include hydrogen radicals.

As mentioned above, under the UV radiation, the oxygen gas is decomposed into oxygen radicals, and ozone molecules can be formed due to the recombination of some free oxygen radicals. The oxygen radicals and ozone molecules can react with the contaminants that remain on the surface of the 2D layered semiconductor, and then the contaminants are decomposed and removed. Similarly, the hydrogen gas is decomposed into hydrogen radicals under the UV radiation. The hydrogen radicals also can react with the contaminants to facilitate the decomposition and removal of the contaminants.

In the instant embodiment, the pre-processing apparatus 31 further includes a control unit 316 electrically connected to the light-emitting unit 313. Since the active particles also can damage the 2D layered semiconductor under the condition of providing the UV radiation too long, the UV radiation unit is controlled by the control unit 316 to periodically switch on and off to prevent the 2D layered semiconductor from damage. In another embodiment, the UV radiation is periodically switched on and off by using a chopper.

Specifically, the control unit 316 can be set to control the UV radiation to switch on for 10 seconds, and then to switch off for less than one minutes during an on/off cycle. The number of on/off cycles of the UV radiation can be determined according to actual demand.

Figure 7:
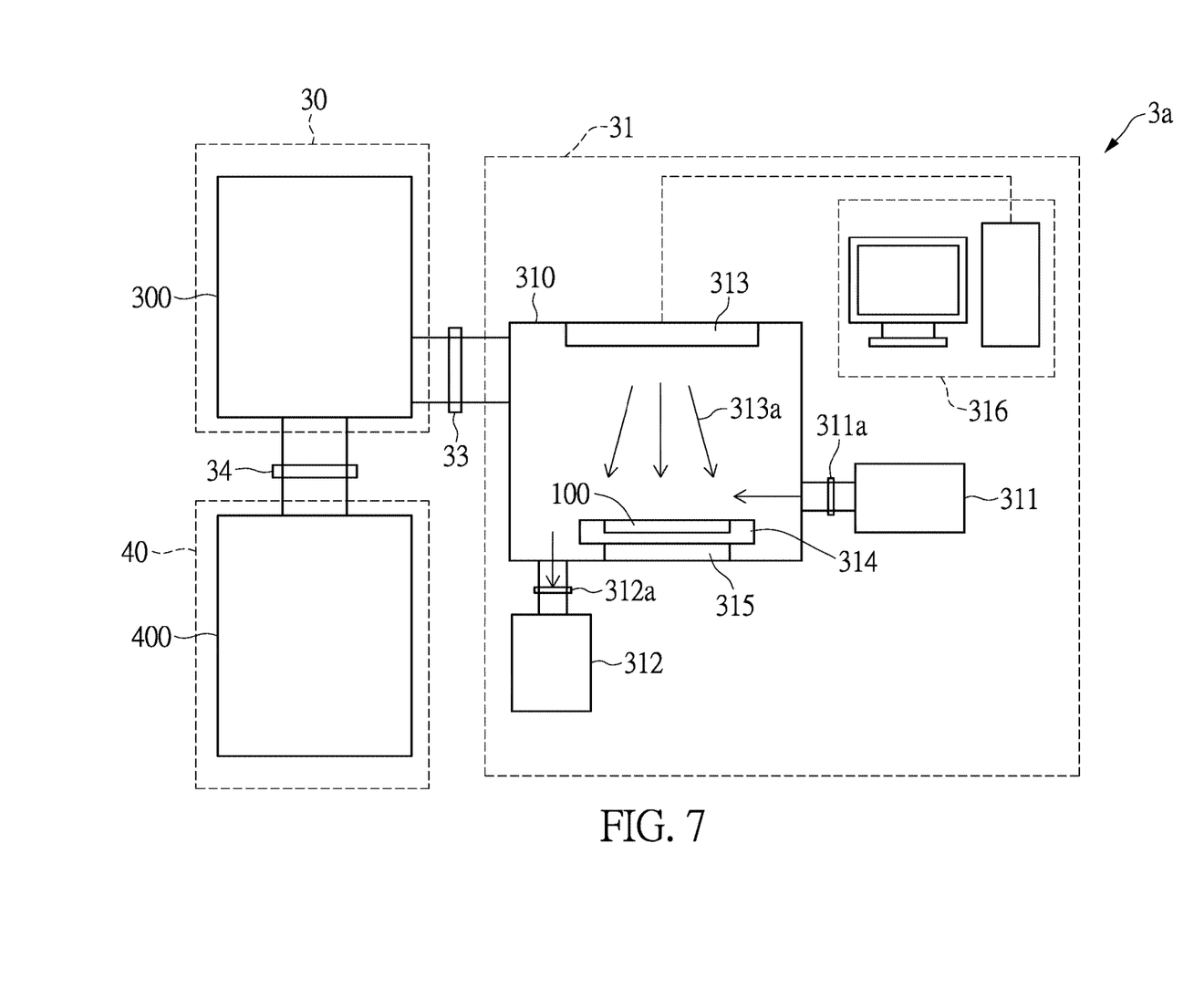
FIG. 7 shows a schematic diagram illustrating a manufacturing system for forming a contact between a 2D layered semiconductor and a functional layer in accordance with another embodiment of the instant disclosure.

Please refer to FIG. 7. FIG. 7 shows a schematic diagram illustrating manufacturing systems for forming a clean interface or a contact between a 2D layered semiconductor and a functional layer in accordance with another embodiment of the instant disclosure.

The manufacturing system 3*a* further includes a second main apparatus 40. In the manufacturing system 3*a*, the first and second main apparatus 30 and 40 are in fluid communication with the pre-processing apparatus 31 in series. The first main apparatus 30 and the second main apparatus 40 can be respectively a deposition apparatus and an inspection apparatus. In one embodiment, the first main apparatus 30 is an inspection apparatus, and the second main apparatus 40 is a deposition apparatus. After the removing process is performed on the substrate 100 equipped with the 2D layered semiconductor by the pre-processing apparatus 31, the substrate 100 can be firstly in-situ transferred into the first main apparatus 30 for the characteristics of the 2D layered semiconductor to be inspected by the first main apparatus 30. Thereafter, the substrate 100 is in-situ transferred from the first main apparatus 30 into the second main apparatus 40 for deposition.

In another embodiment, the first main apparatus 30 is a deposition apparatus, and the second main apparatus 40 is an inspection apparatus. Upon the circumstance, the sequence of the deposition and the inspection processes can be performed in reverse.

As shown in FIG. 7, another control valve 34 is fluidly coupled to the first and second chambers 300, 400 containing fluid of different pressures for regulating flow therebetween. Furthermore, after the process is performed on the substrate 100 in the first main chamber 300, the control valve 34 opens so as to allow the substrate 100 to be transferred into the second main chamber 400 and then proceed to the following process step.

Figure 8:
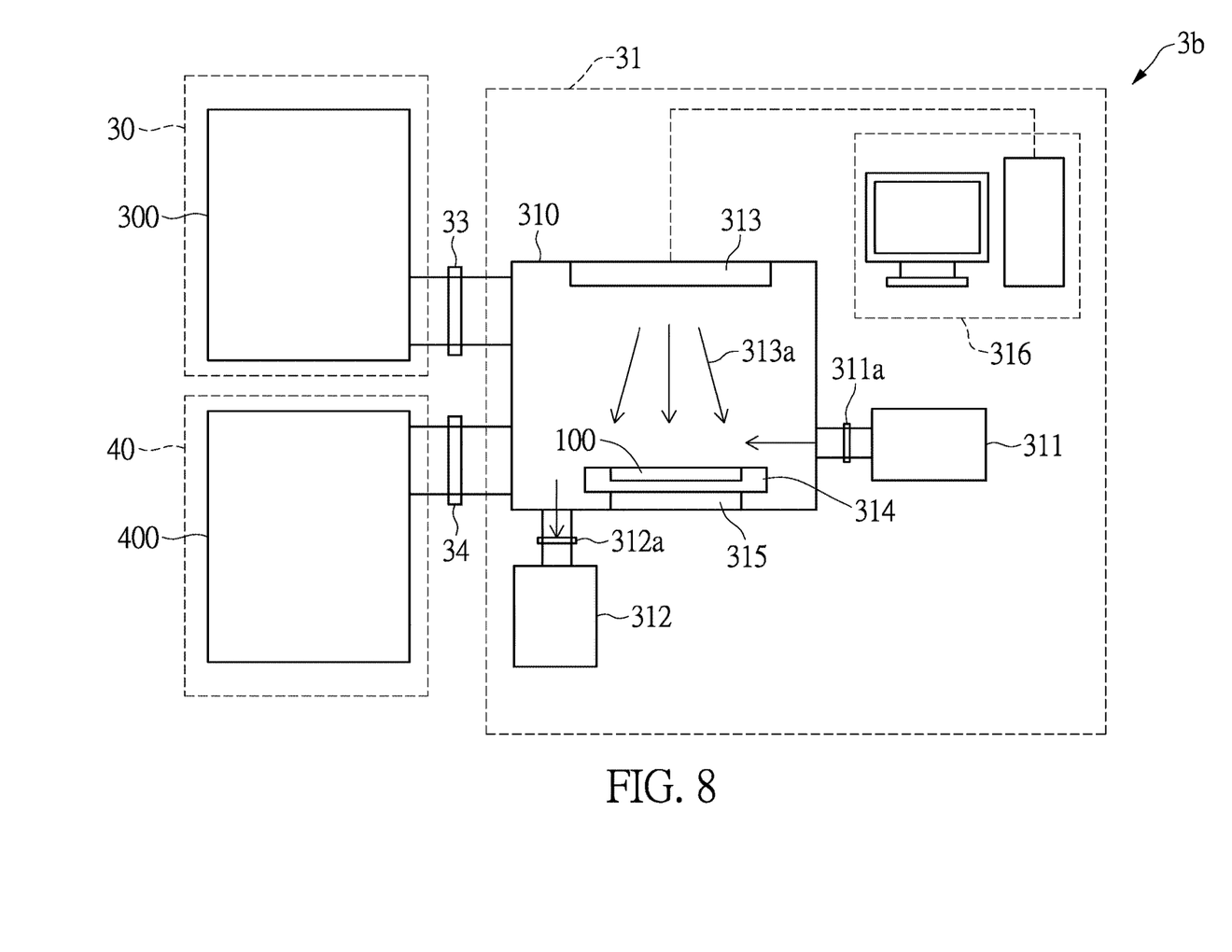
FIG. 8 shows a schematic diagram illustrating a manufacturing system for forming a contact between a 2D layered semiconductor and a functional layer in accordance with another embodiment of the instant disclosure.

Please refer to FIG. 8. In the manufacturing system 3*b* of the instant embodiment, the first and second main apparatus 30 and 40 are in fluid communication with the pre-processing apparatus 31 in parallel. Thus, the two control valves 33, 34 are respectively fluidly coupled to the first main chamber 300 and the second main chamber 400. The first main apparatus 30 and the second main apparatus 40 can be respectively a deposition apparatus and an inspection apparatus. In another embodiment, both of the first main apparatus 30 and the second main apparatus 40 are deposition apparatus for depositing different materials on the substrate 100 or inspection apparatus for inspecting different characteristics of the 2D layered semiconductors.

To sum up, in the manufacturing system and the method for forming a clean interface between the functional layer and the 2D layered semiconductor provided in the instant disclosure, the contaminants, such as photoresist residues, on the surface of the 2D layered semiconductor can be decomposed and removed without damage the 2D layered semiconductor by providing a stimulus for the reaction gas to generate active particles. The active particles react with the contaminants more easily than with the 2D layered semiconductor due to the higher crystallinity of the 2D layered semiconductor. Accordingly, by controlling the reaction time, the contaminants can be completely removed from the surface of the 2D layered semiconductor without damage of the 2D layered semiconductor.

Additionally, in the method provided in one embodiment of the instant disclosure, the surface layer can be oxidized so that a lower contact resistance between the functional layer and the 2D layered semiconductor can be obtained, thereby improving the electrical performance of the fabricated electronic device.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A method for forming a contact between a functional layer and a 2D layered semiconductor comprising:
   providing a substrate having the 2D layered semiconductor, wherein the 2D layered semiconductor is a metal based chalcogenide film;
   forming a photoresist layer on the 2D layered semiconductor;
   patterning the photoresist layer to form at least one contact opening;
   exposing the substrate equipped with the 2D layered semiconductor and the patterned photoresist layer to a reaction gas;
   inducing a chemical reaction on the reaction gas by periodically providing a stimulus to generate active particles having higher selectivity toward contaminants on the exposed surface of the 2D layered semiconductor so that the contaminants are removed; and
   in-situ forming a functional layer within the at least one contact opening to be in contact with the 2D layered semiconductor.

2. The method according to claim 1, wherein the photoresist residues are formed separately in the at least one contact opening.

3. The method according to claim 1, wherein the stimulus is UV radiation and the reaction gas is oxygen gas or hydrogen gas.

4. The method according to claim 3, wherein the step of inducing the chemical reaction by providing the stimulus further comprises:
   periodically switching the UV radiation using a chopper.

5. The method according to claim 1, wherein the reaction gas is oxygen gas and the active particles include oxygen radicals and ozone.

6. The method according to claim 1, further comprising heating the substrate to a reaction temperature before the step of introducing the chemical reaction on the reaction gas, wherein the reaction temperature substantially ranges from 25 to 100° C.

7. The method according to claim 1, wherein before the step of in-situ depositing the functional layer, the method further comprises:
   stopping providing the stimulus and the reaction gas; and
   annealing the substrate during a predetermined time after the step of stopping providing the stimulus and the reaction gas.

8. The method according to claim 1, further comprising:
removing the patterned photoresist layer after depositing the functional layer within the at least one contact opening.

9. The method according to claim 1, further comprising:
in-situ oxidizing a part of a surface layer of the 2D layered semiconductor exposed from the contact opening during the step of inducing the chemical reaction on the reaction gas; and
keeping the oxidized part of the surface layer between the 2D layered semiconductor and the functional layer.

10. A method for forming a contact between a functional layer and a 2D layered semiconductor comprising:
providing a substrate having an initial 2D layered semiconductor, wherein the 2D layered semiconductor is a metal based chalcogenide film;
exposing the substrate having the initial 2D layered semiconductor to a reaction gas;
inducing a chemical reaction on the reaction gas by periodically providing a stimulus to generate active particles for chemically reacting with a surface layer of the initial 2D layered semiconductor; and
forming a functional layer to be in contact with a treated surface of the 2D layered semiconductor.

11. The method according to claim 10, wherein the stimulus is UV radiation and the reaction gas is oxygen gas or hydrogen gas.

12. The method according to claim 10, wherein the active particles includes oxygen radicals and ozone, and the active particles oxidize the surface layer.

13. The method according to claim 12, wherein the step of inducing a chemical reaction on the reaction gas further comprises: maintaining the substrate at a first temperature during a first time period to clean contaminants adsorbed to a surface of the initial 2D layered semiconductor, wherein the first temperature ranges from 25° C. to 50° C.

14. The method according to claim 13, wherein the step of inducing a chemical reaction on the reaction gas comprises:
after the step of cleaning the contaminants, heating and maintaining the substrate at a second temperature ranging from 80° C. to 120° C., and increasing a supply of the reaction gas during a second time period so as to form a chemically treated surface layer.

15. A method for forming a contact between a functional layer and a 2D layered semiconductor comprising:
providing a substrate having the 2D layered semiconductor;
forming a photoresist layer on the 2D layered semiconductor;
patterning the photoresist layer to form at least one contact opening;
heating the substrate to a reaction temperature substantially ranging from 25° C. to 100° C.;
exposing the substrate equipped with the 2D layered semiconductor and the patterned photoresist layer to a reaction gas;
inducing a chemical reaction on the reaction gas by periodically providing a stimulus to generate active particles having higher selectivity toward contaminants on the exposed surface of the 2D layered semiconductor so that the contaminants are removed; and
in-situ forming a functional layer within the at least one contact opening to be in contact with the 2D layered semiconductor.

16. A method for forming a contact between a functional layer and a 2D layered semiconductor comprising:
providing a substrate having an initial 2D layered semiconductor;
exposing the substrate having the initial 2D layered semiconductor to a reaction gas;
maintaining the substrate at a first temperature during a first time period to clean contaminants adsorbed to a surface of the initial 2D layered semiconductor, wherein the first temperature ranges from 25° C. to 50° C.;
heating and maintaining the substrate at a second temperature ranging from 80° C. to 120° C., and increasing a supply of the reaction gas during a second time period so as to form a chemically treated surface layer; and
forming a functional layer to be in contact with a treated surface of the 2D layered semiconductor.

* * * * *